United States Patent
Das et al.

(10) Patent No.: US 9,258,001 B1
(45) Date of Patent: Feb. 9, 2016

(54) DUAL-INPUT OSCILLATOR FOR REDUNDANT PHASE-LOCKED LOOP (PLL) OPERATION

(71) Applicant: Cirrus Logic, Inc., Austin, TX (US)

(72) Inventors: Tejasvi Das, Austin, TX (US); Alvin C. Storvik, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 14/016,972

(22) Filed: Sep. 3, 2013

(51) Int. Cl.
*H03L 7/087* (2006.01)
*H03L 7/093* (2006.01)
*H03L 7/14* (2006.01)
*H03L 7/10* (2006.01)
*H03L 7/107* (2006.01)

(52) U.S. Cl.
CPC ............... *H03L 7/148* (2013.01); *H03L 7/087* (2013.01); *H03L 7/093* (2013.01); *H03L 7/103* (2013.01); *H03L 7/105* (2013.01); *H03L 7/1075* (2013.01); *H03L 7/146* (2013.01); *H03L 2207/06* (2013.01)

(58) Field of Classification Search
CPC ........... H03L 7/08; H03L 7/085; H03L 7/087; H03L 7/093; H03L 7/101; H03L 7/102; H03L 7/103; H03L 7/105; H03L 7/107; H03L 7/1072; H03L 7/1075; H03L 7/14; H03L 7/146; H03L 2207/06
USPC ............ 327/147, 156; 331/10, 11, 14, 16–18, 331/44; 375/373–376
See application file for complete search history.

(56) References Cited

U.S. PATENT DOCUMENTS

| | | | |
|---|---|---|---|
| 4,947,407 A | 8/1990 | Silvian | |
| 5,557,648 A | 9/1996 | Ishihara | |
| 6,137,372 A * | 10/2000 | Welland | 331/117 R |
| 6,342,818 B1 | 1/2002 | Segawa et al. | |
| 6,731,146 B1 | 5/2004 | Gallardo | |
| 6,980,062 B2 * | 12/2005 | Fujita | 331/176 |
| 7,082,177 B2 * | 7/2006 | Arkiszewski | 375/376 |
| 7,256,629 B2 * | 8/2007 | Zachan et al. | 327/156 |
| 7,292,119 B2 * | 11/2007 | Urakawa | 331/179 |
| 7,427,881 B2 | 9/2008 | Starr et al. | |
| 7,443,252 B2 * | 10/2008 | Tu et al. | 331/44 |
| 7,616,066 B2 * | 11/2009 | Ishii et al. | 331/16 |
| 8,120,430 B1 | 2/2012 | Vasudevan | |
| 8,179,174 B2 * | 5/2012 | Bunch | 327/156 |
| 8,531,244 B2 * | 9/2013 | Shibata et al. | 331/11 |
| 2003/0048139 A1 * | 3/2003 | Chien et al. | 331/11 |
| 2006/0208808 A1 * | 9/2006 | Bang et al. | 331/16 |
| 2006/0226916 A1 * | 10/2006 | Florescu et al. | 331/16 |
| 2008/0191762 A1 | 8/2008 | Seethamraju et al. | |
| 2010/0026406 A1 * | 2/2010 | Fujiwara et al. | 331/36 R |
| 2012/0280735 A1 | 11/2012 | Zhang et al. | |

* cited by examiner

*Primary Examiner* — Levi Gannon
(74) *Attorney, Agent, or Firm* — Norton Rose Fulbright US LLP

(57) ABSTRACT

An oscillator of a phase-locked loop (PLL) or frequency-locked loop (FLL) may include two inputs. The two inputs may include a first analog input and a second digital input. The second digital input may receive a digital signal setting a desired output clock frequency of the oscillator and/or indicating an approximate frequency of frequency range for output by the oscillator. The first analog input may receive a voltage representative of a desired frequency for the output clock frequency of the PLL or FLL to fine-tune the output frequency from the approximate frequency set by the second digital input. The first analog input may be generated from a master clock input signal. When the master clock input signal disappears, the second digital signal controls the output frequency of the oscillator to allow redundant operation of the PLL or FLL even when no master clock input signal is present.

26 Claims, 10 Drawing Sheets

DUAL-INPUT OSCILLATOR FOR REDUNDANT PHASE-LOCKED LOOP (PLL) OPERATION

FIELD OF THE DISCLOSURE

The instant disclosure relates to integrated circuits. In particular, the instant disclosure relates to integrated circuit oscillators.

BACKGROUND

Integrated circuits may include many components, and each of the components may operate from and/or be synchronized with a clock signal. When the clock signal becomes unavailable, the components may fail to operate and/or fall out of synchronization. The integrated circuits then begin producing erroneous output and eventually cease operating. For example, when the output of one component is communicated to the input of another component, the two components may be synchronized such that the second component knows when the first component has output data intended for reading by the second component.

A phase-locked loop (PLL) is one component that operates from a clock signal. The phase-locked loop (PLL) receives an input clock signal and generates a clock signal that may be used to operate and/or synchronize other components. In particular, a phase-locked loop (PLL) generates an output clock with a phase and/or frequency that has a determined relationship to an input clock's phase and frequency, such as the master clock's phase and frequency. The output clock signal from the phase-locked loop (PLL) may be used to operate, for example, audio components such as an audio amplifier.

FIG. 1 is a block diagram illustrating a conventional phase-locked loop (PLL). A phase-locked loop (PLL) 100 may include a phase-frequency detector (PFD) 102, which receives a master clock signal MCLK. A charge pump 104 and a loop filter 106 are coupled to the phase-frequency detector (PFD) 102 to condition an output of the phase-frequency detector (PFD) 102 for input to a voltage-controlled oscillator (VCO) 108. The oscillator 108 generates a clock signal, such as a square wave, based on the input to the oscillator 108 from the phase-frequency detector (PFD) 102, the charge pump 104, and the loop filter 106. A divider 110 closes a feedback loop from the oscillator 108 to the phase-frequency detector (PFD) 102. The divider 110 may allow the oscillator 108 to generate a different frequency clock signal than the clock frequency of the master clock input signal MCLK.

The oscillator 108 is dependent upon the master clock input signal MCLK. If the master clock signal input MCLK disappears, then the phase-locked loop 100 will cease functioning correctly. Before the oscillator 108 entirely shuts down, the oscillator 108 may generate an incorrect clock signal output. Components receiving the incorrect clock signal output may then also generate erroneous output. For example, if audio components are operating from the output clock signal of the oscillator 108, then the audio components may generate undesirable noise from a speaker when the master clock signal input MCLK disappears.

The master clock signal input MCLK may disappear due to, for example, glitches in other components coupled to the phase-locked loop (PLL) 100, a malfunction in the system that generates the master clock, or an external broken link in the master clock distribution network. Regardless of the reason for the loss of the master clock signal input MCLK, it is undesirable that the phase-locked loop (PLL) 100 generate an erroneous clock signal output that may negatively impact components, such as the audio components.

One conventional solution is to open the phase-locked loop (PLL) 100 by disconnecting the voltage-controlled oscillator 108 from the charge pump 104 when the master clock input signal MCLK disappears. After disconnecting the oscillator 108, a fixed voltage input may be provided to the oscillator 108 to allow the oscillator 108 to continue to output a clock signal. However, the fixed voltage input to the oscillator 108 will produce a different frequency output signal than that generated when the phase-locked loop (PLL) 100 is closed and providing input to the oscillator 108.

A conventional phase-locked loop (PLL) may attempt to set a fixed voltage at the input to the oscillator 108 similar to the voltage level at the oscillator 108 before the master clock input signal MCLK disappears. However, the voltage level will have changed before the phase-locked loop (PLL) can determine the master clock input signal MCLK has disappeared. Thus, the voltage level locked and input to the oscillator 108 will not be the needed voltage level to hold the oscillator 108 at the desired frequency.

Shortcomings mentioned here are only representative and are included simply to highlight that a need exists for improved phase-locked loops (PLLs), particularly for consumer-level devices. Embodiments described here address certain shortcomings but not necessarily each and every one described here or known in the art.

SUMMARY

In certain embodiments, an oscillator may have a first input and a second input, and the oscillator may generate an output signal based on the first input and the second input. The first input may be an analog input, which receives a signal corresponding to the master clock signal input, and the second input may be a digital input. The oscillator may generate the clock signal based on input from the first input and the second input. Thus, when the first input, which may be based on the master clock input signal, is unavailable, then the oscillator may still generate an output clock signal at a desired frequency. The master clock signal described here may include any clock signal generated external to the oscillator. The oscillator may be part of a phase-locked loop (PLL).

The oscillator may operate in several modes to generate an output clock signal. In a first mode, the master clock signal may be present and the first input is generated by the PLL loop to be representative of a desired clock frequency for the output clock signal and derived from the master clock signal. The oscillator may generate the output clock based on the first input and the second input by allowing the second input to select a frequency range and fine-tuning the output clock frequency with the first input. The first input may be adjusted by the PLL loop to maintain an output clock at the desired clock frequency. In a second mode, the master clock signal may be missing but not yet detected by the oscillator. During the period before the missing master clock signal is detected, the oscillator may generate the output clock based on input from the second input to maintain the output clock at approximately the desired output clock frequency. When the oscillator detects the missing master clock signal, the oscillator enters a third mode and sets a fixed voltage at the first input. The oscillator then generates the output clock based on the first input and the second input to maintain the output clock at the desired clock frequency. When the master clock signal returns and is detected by the oscillator, then the oscillator may return to the first mode and generate the output clock based on the first input and the second input.

According to one embodiment, an apparatus may include an oscillator having a first input node configured to receive a first signal, a second input node configured to receive a second signal, and a clock output node configured to output a clock signal. The oscillator may be configured to generate the clock signal based, at least in part, on a first voltage of the first signal and a second voltage of the second signal.

The apparatus may also include an analog signal input node coupled to the first input node and configured to receive an analog voltage representative of a desired clock frequency for the output clock signal; a digital code generator coupled to the second input node; a digital-to-analog converter (DAC) in the oscillator configured to receive a digital code from the second input node; a calibration circuit coupled to the digital code generator, in which the calibration circuit is configured to store at least one code corresponding to at least one clock frequency for the oscillator; a clock monitoring circuit coupled to the master clock node, in which the clock monitoring circuit is configured to configure the oscillator to generate the clock signal based on the second input when no master clock signal is detected at the master clock node; a charge pump coupled to the first input node of the oscillator; and/or a switch coupled between the charge pump and the oscillator.

In certain embodiments, the calibration circuit may be configured to power down during normal operation of the oscillator; the clock monitoring circuit may be configured to open the switch when no master clock signal is detected at the master clock node; the clock monitoring circuit may be configured to detect an input at the master clock node after the oscillator is configured to generate the clock signal based on the second input; the clock monitoring circuit may be configured to configure the oscillator to generate the clock signal based, at least in part, on the first input and the second input; the clock monitoring circuit may be configured to set a first voltage at the first input node, in which the first voltage is between a supply voltage and a ground voltage; and/or the apparatus may be a phase-locked loop (PLL) or a frequency-locked loop (FLL).

In one embodiment, an apparatus may include an oscillator having a clock output node configured to output a clock signal generated by the oscillator; an analog input node configured to receive an analog signal representative of a desired clock frequency for the clock signal; a digital input node configured to receive a digital signal corresponding to the desired clock frequency for the output clock signal; and a digital storage element coupled to the digital input node and configured to store at least one digital code corresponding to a clock frequency for the clock signal. The oscillator may be configured to, when the analog input signal is within a range defined by a high threshold and a low threshold, generate a clock based on a first combination of the analog input signal and the digital input signal. The oscillator may also be configured to, when the analog input signal is outside the range, disconnect the analog input signal and generate a clock based on a second combination of a digital input signal and a predetermined signal applied at the analog input node.

According to another embodiment, a method may include receiving a first input at an oscillator, receiving a second input at the oscillator, and generating a clock signal at the oscillator based, at least in part, on a voltage at the first input and a voltage at the second input.

The method may also include calibrating the digital code to the desired clock frequency; setting an output frequency of the clock signal to a frequency range based on the second input; setting the output frequency of the clock signal to a frequency within the frequency range based on the first input; determining the master clock signal is not present and when the master clock signal is determined to be not present, generating the clock signal based on the second input and programming a loop filter coupled to the oscillator for a second bandwidth from a first higher bandwidth and a second phase margin from a lower first phase margin; determining when the master clock signal returns after determining the master clock signal is not present and when the master clock signal is determined to return, generating the clock signal based on the first input and the second input and reprogramming the loop filter for the first bandwidth and the first phase margin; recording a first relative temperature when calibrating the code to the clock frequency; measuring a second relative temperature when the master clock signal is determined to be not present and adjusting the calibration corresponding to a difference between the first relative temperature and the second relative temperature; and/or executing a phase locked loop (PLL) from the generated clock signal.

In certain embodiments, the step of receiving the first input may include receiving an analog voltage representative of a desired clock frequency for the output clock signal; the step of receiving the second input may include receiving a digital code corresponding to a clock frequency; the step of generating the clock signal may include, when the first input exceeds a high threshold or falls below a low threshold, generating the clock signal in the frequency range and/or at the desired clock frequency based on the second input; and/or the step of generating the clock signal based on the second input may include setting the first input to a voltage between a high supply voltage and a low supply voltage.

In one embodiment, a method may include receiving an analog input at an oscillator representative of a desired clock frequency for an output clock signal; receiving a digital input at the oscillator corresponding to the desired clock frequency for the output clock signal; storing the digital input in a digital storage element of the oscillator; generating the output clock signal by the oscillator based, at least in part, on the analog input; and generating the clock output signal by the oscillator based, at least in part, on the stored digital input when the analog signal is above a high threshold or below a low threshold.

According to a further embodiment, an apparatus may include a first input node configured to receive a first signal, a second input node configured to receive a second signal, a clock output node configured to output a clock signal, and means for generating a clock signal, the clock generating means coupled to the first input node, the second input node, and the clock output node.

The apparatus may also include means for generating a digital input coupled to the second input node and/or means for calibrating the digital input coupled to the digital input generating means.

In one embodiment, a phase locked loop (PLL) may include a master clock input node configured to receive a master clock signal; a phase-frequency detector (PFD) coupled to the master clock input node and a feedback divider; a charge pump coupled to the phase-frequency detector, wherein the charge pump comprises a loop filter; and an oscillator, coupled to the charge pump and the feedback divider. The oscillator may include a clock output node configured to output a clock signal generated by the oscillator; an analog input node configured to receive an analog signal representative of a desired clock frequency for the output clock signal; a digital input node configured to receive a digital signal corresponding to the desired clock frequency for the clock signal; and a digital storage element coupled to the digital input node and configured to store at least one digital code corresponding to a clock frequency for the output clock signal. The oscillator may be configured to, when the master clock signal is present at the master clock input node, generate a clock based on a first combination of the analog input signal and the stored at least one digital code. The oscillator may also be configured to, when the master clock signal frequency is above a high threshold or below a low threshold, disconnect the analog input signal from the analog input node and generate an output clock based on a second combination of a stored at least one digital code and a predetermined analog signal applied at the analog input node.

In another embodiment, a method may include generating, through a phase locked loop (PLL), a second clock signal from a first master clock signal at a desired clock frequency different from a master clock frequency of the first master clock signal, wherein the second clock signal is generated by an oscillator comprising an analog input node, a digital input node, a clock output node, and a digital storage element, and wherein the second clock frequency is based, at least in part, on an analog input at the analog input node and the digital storage element of the oscillator; storing at least one digital code, corresponding to at least one output clock frequency of the oscillator, in the digital storage element of the oscillator received from the digital input node; detecting that the first master clock signal is outside of a range when the clock frequency is higher than a high threshold or lower than a low threshold; when the master clock signal frequency is outside of the range, discarding the analog input signal and generating the second clock signal based on a first combination of the stored at least one digital code and a predetermined analog signal applied at the analog input node of the oscillator; and when the master clock signal frequency is inside of the range, generating the second clock signal based on a second combination of the analog input signal and the digital input code.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 1:
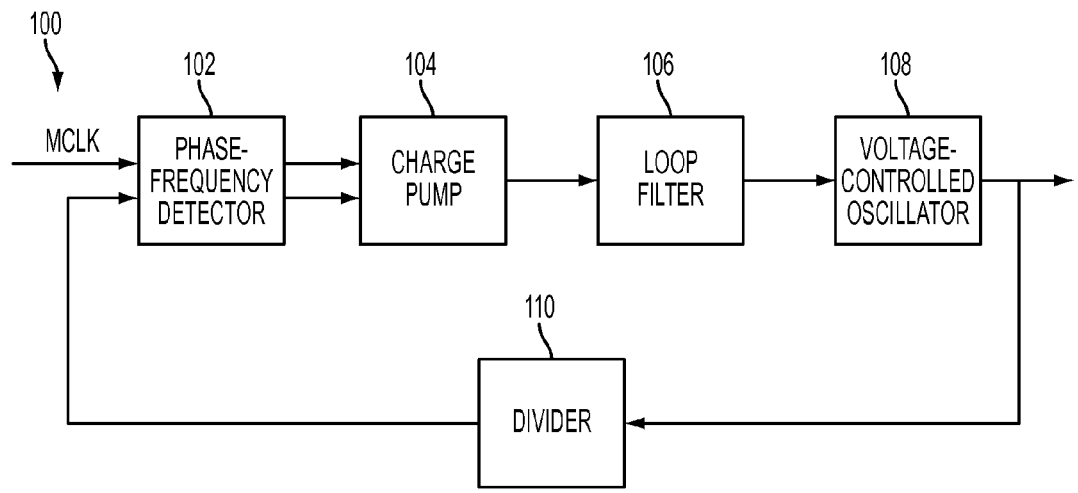
FIG. 1 is a block diagram illustrating a conventional phase-locked loop (PLL).
Figure 2:
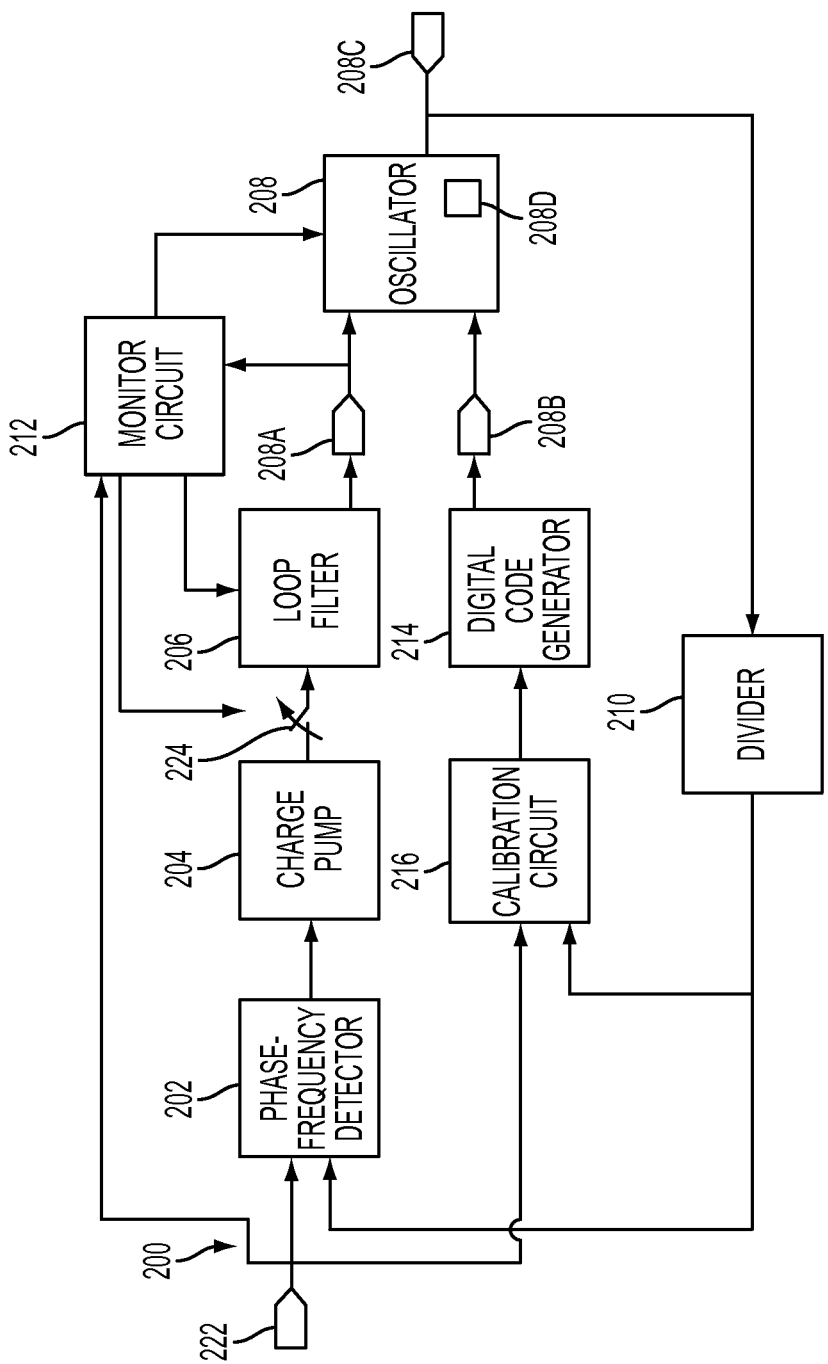
FIG. 2 is a block diagram illustrating a phase-locked loop (PLL) with an oscillator having two inputs according to one embodiment of the disclosure.

FIG. 2 is a block diagram illustrating a phase-locked loop (PLL) with an oscillator having two inputs according to one embodiment of the disclosure. A phase-locked loop (PLL) 200 may include an oscillator 208 having a first input node 208A and a second input node 208B. The first input node 208A may receive an input from a path including a loop filter 206, a charge pump 204, and a phase-frequency detector (PFD) 202, which receive a master clock input signal at input node 222. The input node 222 may receive a master clock input signal from an external component. The input signal to the input node 208A may be an analog input representative of a desired clock frequency for an output clock signal from the oscillator 208. The analog input at the input node 208A may be generated by the phase-frequency detector (PFD) 202, the charge pump 204, and the loop filter 206 based on the master clock input signal received at the input node 222. A divider 210 may be coupled between the oscillator 208 and the phase-frequency detector (PFD) 202 to close a feedback loop in the phase-locked loop (PLL) 200.

The second input node 208B may receive an input from a digital code generator 214. The oscillator 208 may include a digital storage element 208D, such as a memory or a register, to store at least one digital code from the digital code generator 214. The digital code generator 214 may generate a digital signal for input to the oscillator 208 through the second input node 208B. The digital signal may be a multi-bit n-length signal, such as a 4-bit code. Each code generated by the digital code generator 214 may produce a different frequency output clock signal from the oscillator 208. A calibration circuit 216 may be coupled to the digital code generator 214. At certain times, the calibration circuit 216 may instruct the digital code generator 214 to output certain codes such that the calibration circuit 216 may measure the output frequency from the oscillator 208 to correlate each code to a certain frequency or frequency range output by the oscillator 208. The calibration circuit 216 may, for example, execute at start-up of the phase-locked loop (PLL) 200 and shut down after start-up to reduce power consumption by the phase-locked loop (PLL) 200.

The oscillator 208 may generate an output clock signal at an output node 208C based on input at the first input node 208A and the second input node 208B. For example, a digital code received from the second input node 208B may set an approximate frequency for output from the oscillator 208. In one embodiment, the digital code may set the oscillator 208 to the desired clock frequency. In another embodiment, the input of a digital code at the second input node 208B may coarsely determine an output frequency with a margin of error corresponding to a frequency range. Input to the oscillator 208 may receive an analog input through the first input node 208A to fine-tune an output frequency of the oscillator 208.

A clock monitor circuit 212 may be coupled to the first input node 208A to determine when an input to the oscillator 208 through the first input node 208A disappears, which correlates with a disappearance of the master clock input signal at the input node 222. The monitor circuit 212 may be coupled to the loop filter 206, the oscillator 208, and/or other components within the phase-locked loop (PLL) 200 to configure the components based on the disappearance of the master clock input signal. When the master clock signal input at the input node 222 disappears, the input signal at the first input node 208A will also disappear. The monitor circuit 212 may detect this condition and configure the oscillator 208 to output a clock signal based on the second input signal 208B. The clock monitor circuit 212 may also or alternatively be coupled to the input node 222 (not shown) to determine the presence of a master clock input signal and configure components in the phase-locked loop (PLL) 200 appropriately. In one embodiment, the clock monitor circuit 212 may determine the master clock signal has disappeared when the frequency of the master clock signal exceeds a range defined by a high frequency threshold and a low frequency threshold.

According to one embodiment, the clock monitor circuit 212 may implement an analog or a digital monitoring circuit. For example, a digital monitoring circuit may count a number of transitions at the output of the oscillator 208 between transitions at the input node 222. When the master clock input signal is present, the oscillator 208 should produce a certain number of transitions at the output node 208C based on the desired frequency for the oscillator 208. When the number of transitions at the output node 208C exceeds or is below the expected number of transitions between master clock input signal transitions, the master clock input signal may be determined to have disappeared. The number of transitions at the output node 208C may change because the feedback loop through the phase-locked loop (PLL) may degrade after the master clock input signal is lost. In another example, an analog monitoring circuit may monitor the input voltage at the first input 208A of the oscillator 208. When the first input exceeds a high threshold or falls below a low threshold, the master clock input signal may be determined to have disappeared.

Two input nodes 208A and 208B to the oscillator 208 may allow the oscillator 208 to continue generating an output clock signal even when the master clock input signal disappears, and there is a time delay in the disappearance being recognized. Although a disappearance of the master clock input signal may cause the first input at the first input node 208A to push the clock frequency to zero, the second input at the second input node 208B may hold the output clock frequency. In one embodiment, the second input may hold the output clock frequency at the desired output frequency. In other embodiments, the second input may set only an approximate output clock frequency.

The monitor circuit 212 may also be coupled to the loop filter 206 and configure the loop filer 206 based on the presence of an input signal at the first input node 208A. For example, when the master clock input signal is determined to disappear and the oscillator 208 shifts to generating an output clock signal based on the second input, the loop filter 206 may be programmed for a lower bandwidth and a higher phase margin. When the master clock input signal returns, the loop filter 206 may be programmed to the original bandwidth and phase margin settings. Adjusting the bandwidth and phase margin of the loop filter 206 may create a smoother transition between operating modes of the oscillator 208 when the master clock input signal disappears and may reduce or eliminate overshoots or ripples in the clock output signal frequency.

A switch 224 may be coupled between the oscillator 208 and the charge pump 204. The switch 224 may be controlled by the monitor circuit 212 to open when the master clock signal disappears. Thus, the feedback loop of the phase-locked loop (PLL) 200 is opened and the input signal at the first input node 208A may be disconnected from the oscillator 208. When the master clock input signal re-appears, the monitor circuit 212 may close the switch 224 to reconnect input to the first input node 208A of the oscillator 208. Alternatively or additionally to the switch 224, switches (not shown) within the charge pump 204 may be opened to disconnect the input signal from the first input node 208A of the oscillator 208. In this configuration, the monitor circuit 212 may also be coupled to the charge pump 204 to open and close switches within the charge pump 204 based on a presence of the master clock input signal.

Figure 3:
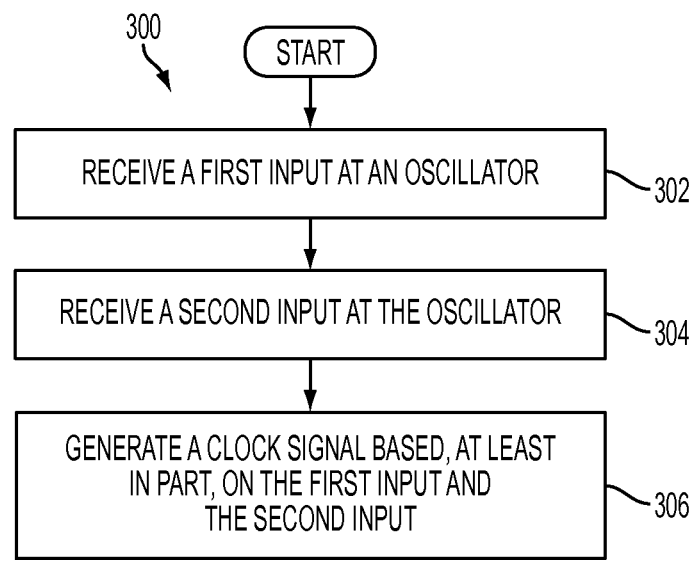
FIG. 3 is a flow chart illustrating a method of generating a clock signal output based on two inputs according to one embodiment of the disclosure.

FIG. 3 is a flow chart illustrating a method of generating a clock signal output based on two inputs according to one embodiment of the disclosure. A method 300 may begin at block 302 with receiving a first input at an oscillator, continue to block 304 with receiving a second input at the oscillator, and at block 306, generating a clock signal based, at least in part, on the first input and the second input. The first input received at block 302 may be, for example, an analog signal representative of a desired clock frequency for the output clock signal. The second input received at block 304 may be, for example, a digital signal representative of a calibrated output frequency range for the oscillator. The clock signal generated at block 306 may be generated by coarsely selecting a frequency range with the second input of block 304 and fine-tuning the selected frequency with the first input of block 302.

Figure 4:
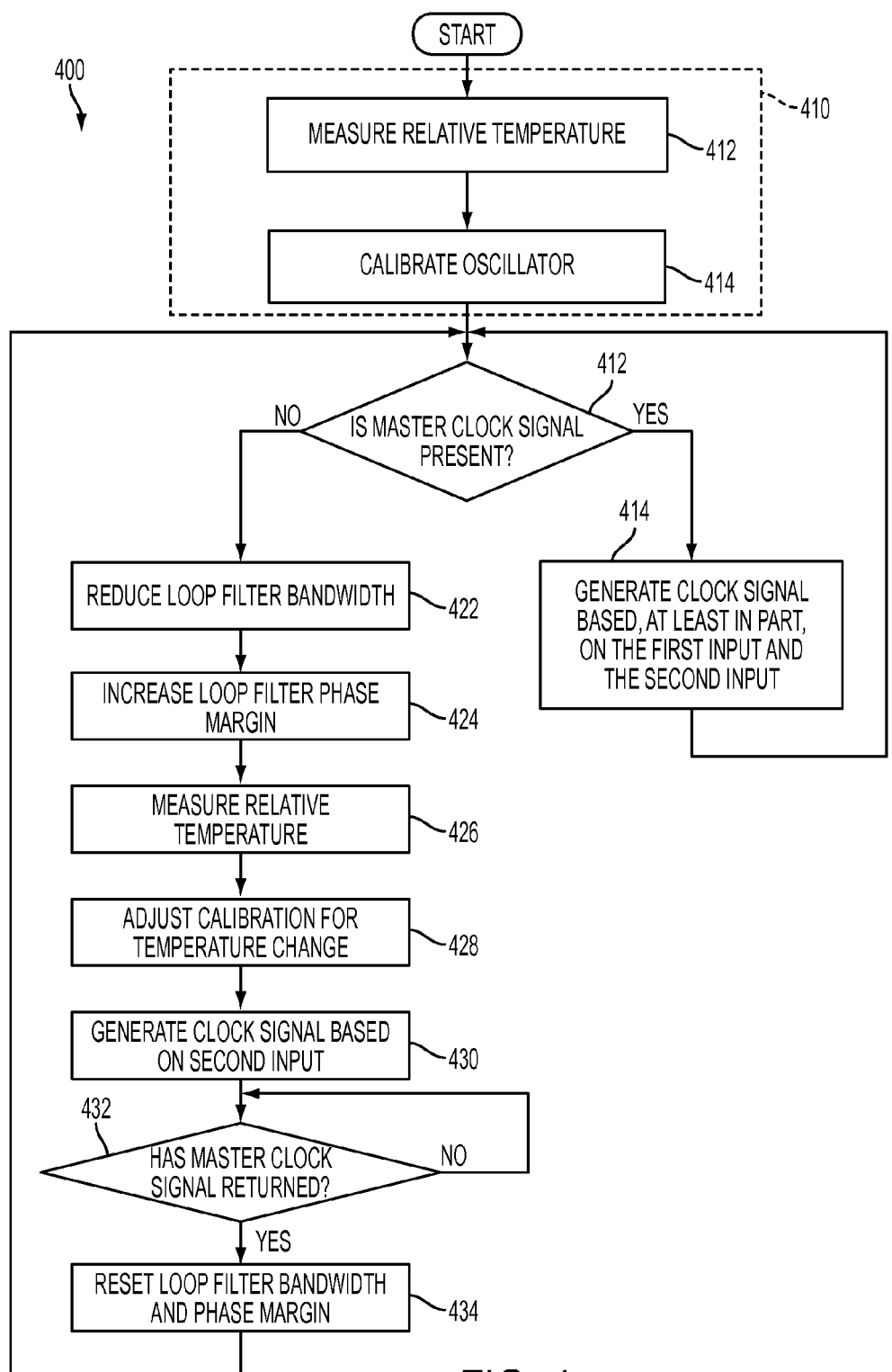
FIG. 4 is a flow chart illustrating a method of operating a phase-locked loop (PLL) according to one embodiment of the disclosure.

Components of a phase-locked loop (PLL), such as the PLL 200 of FIG. 2, may be coordinated by a clock monitoring circuit. FIG. 4 is a flow chart illustrating a method of operating a phase-locked loop (PLL) according to one embodiment of the disclosure. A method 400 may be executed, in part, by a clock monitoring circuit or by other logic circuits coupled to the phase-locked loop (PLL). The method 400 may begin with a start-up phase 410 including measuring a relative temperature at block 412 and calibrating the oscillator at block 414. Calibration at block 414 may include mapping output frequencies of the oscillator to digital input codes provided to the oscillator. For example, a digital input code of 0x01 may correspond to an output frequency of 1.58 megahertz (MHz), and a digital input code of 0x0F may correspond to an output frequency of 13.13 megahertz (MHz). The calibrated digital input codes may be stored, for example, in a memory device, such as random access memory ("RAM") or read only memory ("ROM"), or stored in processor registers. The calibration at block 414 may correspond to the relative measured temperature at block 412, and the calibration may be adjusted based on relative temperature changes measured at a later time. According to one embodiment, calibration at block 414 may include performing a digital search through digital code to find a particular desired frequency for operation of the phase-locked loop (PLL).

At block 412, the method 400 determines whether a master clock input signal is present. If the master clock input signal is present, then the method 400 continues to block 414 to generate the block signal based, at least in part, on the first input and the second input. The method 400 may continue looping through the block 412 and the block 414 until the master clock input signal is determined to not be present. When the master clock input signal is not present at block 412, the method 400 continues to block 422.

Starting at block 422, the phase-locked loop (PLL) may prepare for and operate the oscillator based on the second input to allow the oscillator to continue to produce an output clock signal even though the master clock input signal has disappeared. At block 422, the bandwidth of a loop filter of the phase-locked loop (PLL) may be reduced and, at block 424, the phase margin of the loop filter may be increased. At block 426, a relative temperature may be measured, and, at block 428, the calibration of block 414 may be adjusted for the measured relative temperature of block 426.

At block 430, the output clock signal is generated based on the second input. According to one embodiment, when the master clock signal disappears, the first input of the oscillator may be connected to a predetermined voltage input and the clock signal is then generated based on the second input and the fixed voltage at the first input. The predetermined voltage may be, for example, a point between a high voltage supply and a low voltage supply.

In one embodiment, after the oscillator changes modes to generate an output clock signal when the master clock signal disappears, the phase-locked loop (PLL) may begin to shut down sub-systems dependent on the PLL clock. For example, if the master clock signal input disappearance is related to a larger system-wide failure, the phase-locked loop (PLL) may begin to shut down or transition components, such as analog and/or digital blocks within an integrated circuit, to prevent abnormal behavior. The shutdown may prevent abnormal behavior, such as an audio amplifier outputting audible noise. The phase-locked loop (PLL) may also generate an interrupt signal that can be transmitted to other electronic components to alert the other electronic components to also enter a safe shut-down mode. In one embodiment, components of the PLL, such as the charge-pump, the PFD, and the divider, may be shutdown to conserve power.

In another embodiment, as illustrated in FIG. 4, the phase-locked loop (PLL) may continue to operate without the master clock input signal to allow recovery when the master block input signal returns. At block 432, the phase-locked loop (PLL) determines if the master clock input signal has returned. If the master clock signal has not returned, the method 400 loops at block 432, generating the output clock signal based on the second input, until the master clock signal returns. When the master clock signal returns at block 432, the method 400 continues to block 434 to reset the loop filter bandwidth and phase margin and continue to block 412. If the master clock signal is still present, the method 400 will continue to block 414 to generate the output clock signal based, at least in part, on the first input signal and the second input signal at block 414.

Figure 5:
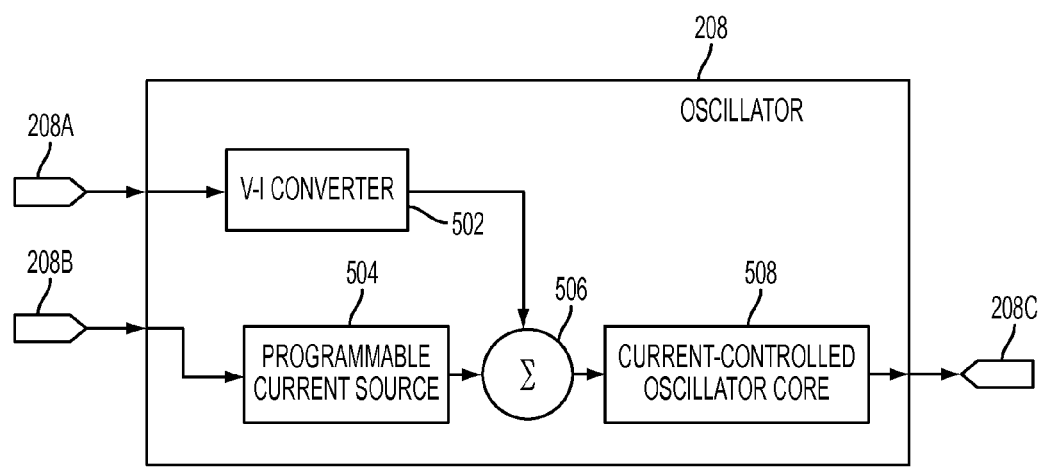
FIG. 5 is a block diagram illustrating an oscillator with two inputs according to one embodiment of the disclosure.

The oscillator, such as the oscillator 208 of FIG. 2, may generate the output clock signal based on the first input signal and the second input signal as described with reference to the method in accordance with the flow charts of FIG. 3 and FIG. 4. In one embodiment, the oscillator 208 may sum currents corresponding to the signals at the first input and the second input and providing the summed current to oscillator components. FIG. 5 is a block diagram illustrating an oscillator with two inputs according to one embodiment of the disclosure.

The oscillator 208 may receive a first input through the first input node 208A and a second input through the second input node 208B. The first input may be provided to a voltage-to-current (V-I) converter 502 within the oscillator 208. The V-I converter 502 may generate a current proportional to the voltage of the input signal at the input node 208A. The second input may be provided to a variable current source 504. The variable current source 504 may function as a simple, monotonic digital-to-analog converter (DAC). A range and resolution of the output frequency of the oscillator 208 may be adjusted through design of the variable current source 504. The variable current source 504 may include a plurality of current sources, in which each current source may be activated by a digital '1' or digital '0' in each bit of the digital signal received at the input node 208B. For example, a digital signal of '1001' may turn on current sources of the plurality of current sources corresponding to bit 1 and bit 4. A current summer 506 may sum the current generated by the V-I converter 502 and the programmable/variable current source 504. The summed current signal output by the summer 506 may be provided to other circuitry 508 within the oscillator to generate the output clock signal at a frequency specified by inputs to the first input node 208A and the second input node 208B.

Figure 6:
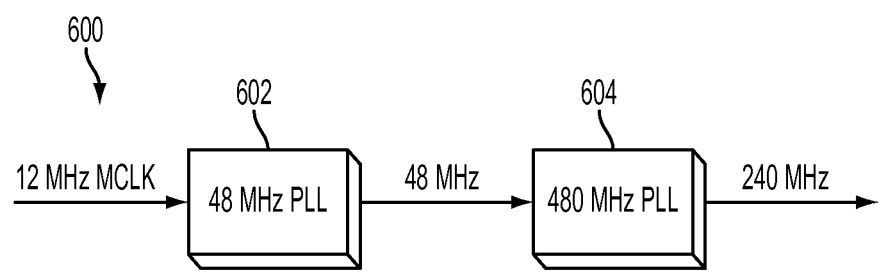
FIG. 6 is a block diagram illustrating a series connection of phase-locked loops (PLLs) according to one embodiment of the disclosure.
Figure 7:
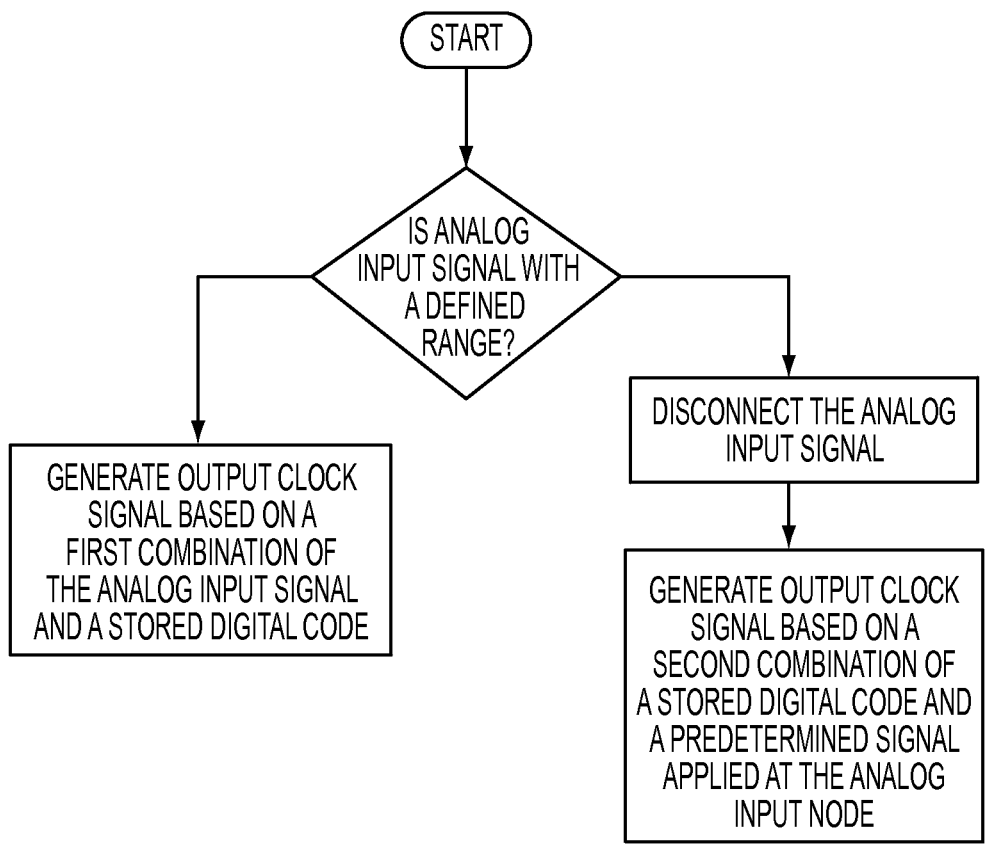
FIG. 7 is a flow chart illustrating a method executable by an oscillator for generating an output clock signal according to one embodiment of the disclosure.
Figure 8:
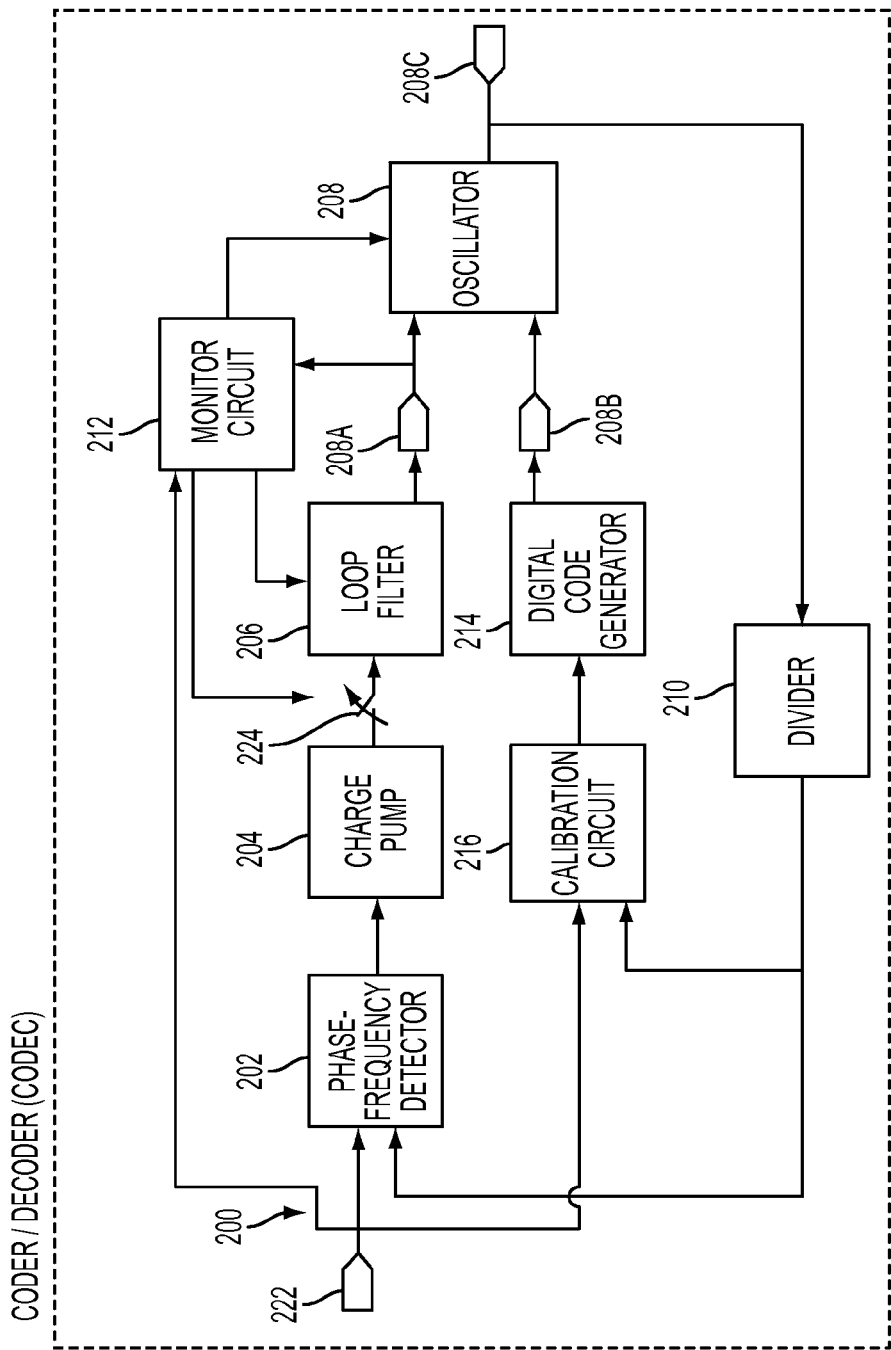
FIG. 8 is a block diagram illustrating a coder/decoder (CODEC) having a phase-locked loop (PLL) with an oscillator having two inputs according to one embodiment of the disclosure.
Figure 9:
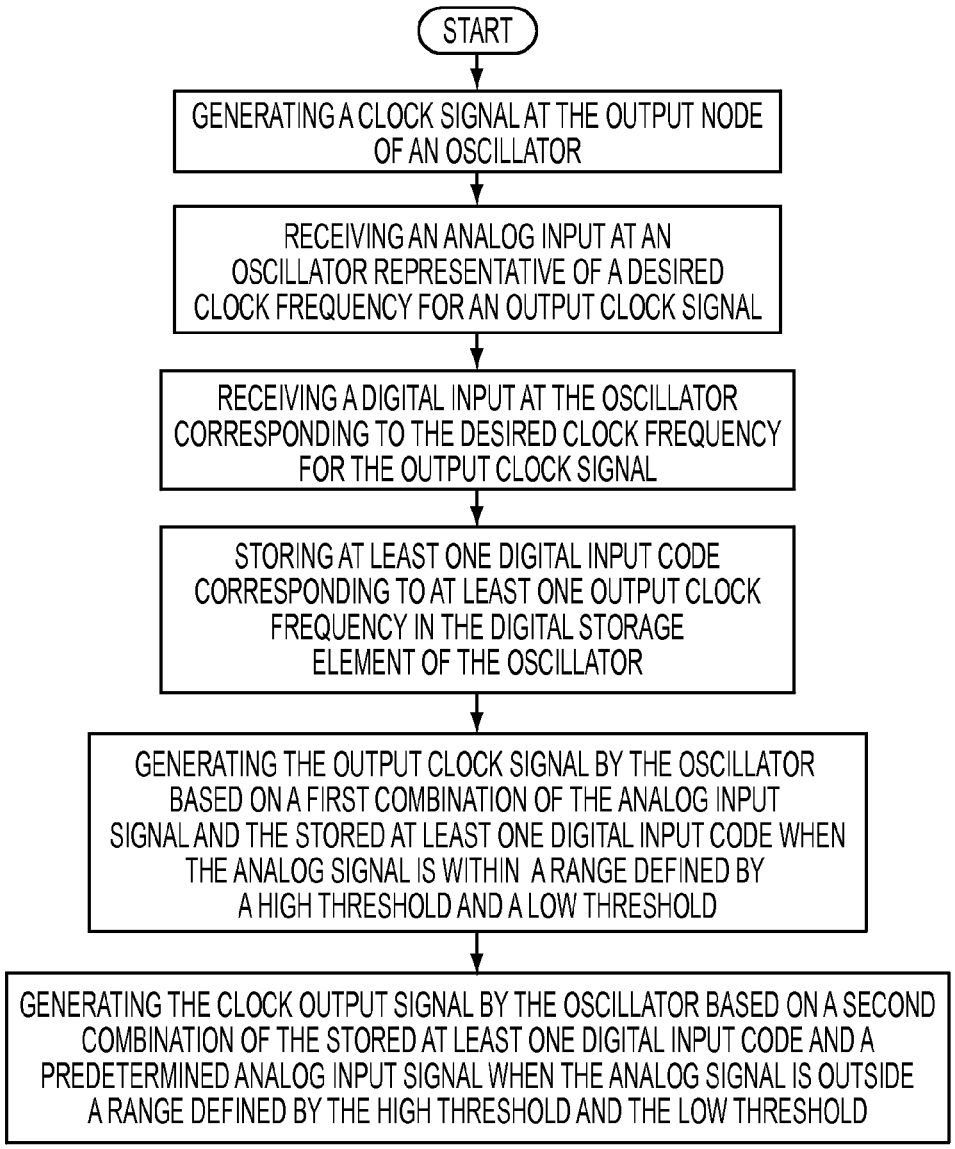
FIG. 9 is a flow chart illustrating a method for generating an output clock signal according to one embodiment of the disclosure.
Figure 10:
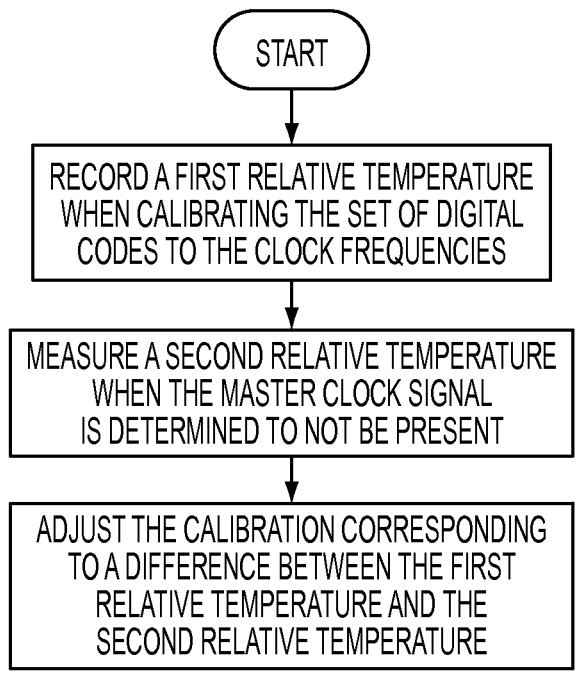
FIG. 10 is a flow chart illustrating a method of adjusting a calibration value according to one embodiment of the disclosure.

FIG. 6 is a block diagram illustrating a series connection of phase-locked loops (PLLs) according to one embodiment of the disclosure. A series 600 of phase-locked loops (PLLs) 602 and 604 may be coupled together to generate multiple output clock signals at different frequencies. For example, the series 600 may receive a 12 megahertz (MHz) master clock input signal and generate a 48 megahertz (MHz) output clock signal from the phase-locked-loop (PLL) 602. The 48 megahertz (MHz) output clock signal may be input as a master clock input signal to the phase-locked loop (PLL) 604 to generate a 240 megahertz (MHz) output clock signal.

Although only two phase-locked loops (PLLs) 602 and 604 are shown, additional phase-locked loops (PLLs) may be coupled to the series 600. According to one embodiment, each of the phase-locked loops (PLLs) 602 and 604 may include a dual-input oscillator as shown in FIG. 2 and FIG. 5. According to another embodiment, the phase-locked loop (PLL) 602 may include a dual-input oscillator, while the phase-locked loop (PLL) 604 may include a conventional oscillator. In this configuration, the dual-input oscillator of the phase-locked loop (PLL) 602 ensures that the phase-locked loop (PLL) 604 does not lose its master clock input signal, which is the output clock signal of the phase-locked loop (PLL) 602. When more phase-locked loops (PLLs) are included in the series 600, the first phase-locked loop (PLL) may include a dual-input oscillator, all but the last phase-locked loop (PLL) may include a dual-input oscillator, or any other combination of phase-locked loops (PLLs) may include a dual-input oscillator.

If implemented in firmware and/or software, the operations described above, such as described with reference to FIG. 3 and FIG. 4, may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
   an oscillator, comprising:
   a clock output node configured to output a clock signal generated by the oscillator;
   an analog input node configured to receive an analog signal representative of a desired clock frequency for the clock signal;
   a digital input node configured to receive a digital signal corresponding to the desired clock frequency for the output clock signal; and
   a digital storage element coupled to the digital input node and configured to store at least one digital code corresponding to a clock frequency for the output clock signal,
   wherein the oscillator is configured to:
      when the analog input signal is within a range defined by a high threshold and a low threshold indicating the analog input signal is present, generate the output clock signal based on a first combination of the analog input signal and the stored at least one digital code;
      when the analog input signal is outside the range:
         disregard the analog input signal; and
         generate the output clock signal based on a second combination of the stored at least one digital code and a predetermined signal applied at the analog input node;
   a digital code generator coupled to the second input node and configured to generate the digital code corresponding to the desired clock frequency for the output clock signal, wherein the digital code is mapped to a particular clock frequency for output by the oscillator; and
   a loop filter coupled to the oscillator, wherein the loop filter is configured to operate at a second bandwidth different from a first higher bandwidth and a second phase margin different from a lower first phase margin when the analog input signal is outside the range.

2. The apparatus of claim 1, further comprising a calibration circuit coupled to the digital code generator, wherein the calibration circuit is configured to store at least one digital code corresponding to at least one clock frequency for the oscillator.

3. The apparatus of claim 2, wherein the calibration circuit is configured to power down during normal operation of the oscillator.

4. The apparatus of claim 1, further comprising:
   a master clock input node; and
   a clock monitoring circuit coupled to the master clock input node and coupled to the oscillator, wherein the clock monitoring circuit is configured to configure the oscillator to generate the clock signal based on the stored at least one digital code when no master clock signal is detected at the master clock node.

5. The apparatus of claim 4, further comprising:
   a charge pump coupled to the analog input node of the oscillator; and
   a switch coupled between the charge pump and the oscillator,
   wherein the clock monitoring circuit is configured to open the switch when no master clock signal is detected at the master clock node.

6. The apparatus of claim 4, wherein the clock monitoring circuit is further configured to:
   detect an input at the master clock node after the oscillator is configured to generate the clock signal based on the stored at least one digital code; and
   configure the oscillator to generate the clock signal based, at least in part, on the analog input.

7. The apparatus of claim 1, wherein the apparatus comprises at least one of a phase-locked loop (PLL) and a frequency-locked loop (FLL).

8. The apparatus of claim 7, wherein the apparatus comprises a coder/decoder (CODEC).

9. The apparatus of claim 1, wherein the oscillator is configured to disregard the analog input signal by disconnecting the analog input signal.

10. A method, comprising:
    generating an output clock signal at a clock output node of an oscillator, wherein the oscillator comprises of an analog input node, a digital input node, and a digital storage element;
    receiving an analog input signal at the analog input node of the oscillator representative of a desired clock frequency for the output clock signal;
    receiving a digital input at the digital input node of the oscillator corresponding to the desired clock frequency for the output clock signal, wherein the digital code is mapped to a particular clock frequency for output by the oscillator;
    storing at least one digital input code corresponding to at least one output clock frequency in the digital storage element of the oscillator;
    generating the output clock signal by the oscillator based on a first combination of the analog input signal and the stored at least one digital input code when the analog signal is within a range defined by a high threshold and a low threshold indicating the analog signal has not disappeared;
    generating the output clock signal by the oscillator based on a second combination of the stored at least one digital input code and a predetermined analog input signal when the analog input signal is outside a range defined by the high threshold and the low threshold indicating the analog signal has disappeared; and programming a loop filter coupled to the oscillator for a second bandwidth from a first higher bandwidth and a second phase margin from a lower first phase margin when the analog signal is outside a range defined by the high threshold and the low threshold indicating the analog input signal has disappeared.

11. The method of claim 10, further comprising calibrating a set of digital codes to corresponding output frequencies of the oscillator.

12. The method of claim 11, further comprising:
recording a first relative temperature when calibrating the set of digital codes to the clock frequencies;
measuring a second relative temperature when the analog input signal is determined to not be present; and
adjusting the calibration corresponding to a difference between the first relative temperature and the second relative temperature.

13. The method of claim 11, further comprising executing at least one of a phase locked loop (PLL) and a frequency locked loop (FLL) from the generated clock output signal.

14. The method of claim 10, wherein the step of generating the output clock signal at the oscillator based, at least in part, on the analog input signal comprises:
setting a frequency of the output clock signal to a frequency range based on the stored at least one digital input code; and
setting the frequency of the output clock signal to a frequency within the frequency range based on the analog input signal.

15. The method of claim 10, further comprising:
determining a master clock signal is not present; and
generating the clock output signal by the oscillator based, at least in part, on the stored at least one digital input code when the master clock signal is determined to not be present.

16. The method of claim 15, wherein the step of generating the clock output signal based on the stored digital input comprises:
setting the analog input signal to a voltage between a high supply voltage and a low supply voltage.

17. The method of claim 15, further comprising:
determining when the master clock signal returns after determining the master clock signal is not present; and
when the master clock signal is determined to return, generating the clock output signal based, at least in part, on the analog input signal; and
reprogramming the loop filter for the first bandwidth and the first phase margin.

18. The method of claim 10, wherein the step of generating the clock output signal by the oscillator based on a second combination comprises disconnecting the analog input signal.

19. A phase locked loop (PLL), comprising:
a master clock input node configured to receive a master clock signal from an external component;
a phase-frequency detector (PFD) coupled to the master clock input node and a feedback divider;
a charge pump coupled to the phase-frequency detector (PFD), wherein the charge pump comprises a loop filter;
an oscillator coupled to the charge pump and the feedback divider, wherein the oscillator comprises:
a clock output node configured to output an output clock signal generated by the oscillator;
an analog input node configured to receive an analog signal representative of a desired clock frequency for the output clock signal;
a digital input node configured to receive a digital signal corresponding to the desired clock frequency for the output clock signal, wherein the digital signal comprises at least one digital code mapped to a particular clock frequency for output by the oscillator; and
a digital storage element coupled to the digital input node and configured to store the at least one digital code corresponding to the desired clock frequency for the output clock signal; and
a digital code generator coupled to the digital input,
wherein the oscillator is configured to:
when the master clock signal from the external component is present at the master clock input node, generate the output clock signal based on a first combination of the analog input signal and the stored at least one digital code, wherein the output clock signal is provided to an audio component separate from the external component;
and
when the master clock signal frequency from the external component is above a high threshold or below a low threshold indicating the master clock signal has disappeared:
disregard the analog input signal from the analog input node; and
generate the output clock signal based on a second combination of the stored at least one digital code and a predetermined analog signal applied at the analog input node, wherein the output clock signal is provided to an audio component separate from the external component; and
a clock monitoring circuit coupled to the master clock input node, wherein the clock monitoring circuit is configured to configure the oscillator to generate the clock signal based on the at least one digital code when no master clock signal is detected at the master clock node, wherein the clock monitoring circuit is configured to program the loop filter for a second bandwidth from a first higher bandwidth and a second phase margin from a lower first phase margin when the master clock signal is determined to not be present.

20. The apparatus of claim 19, further comprising:
a calibration circuit coupled to the digital code generator.

21. The apparatus of claim 20, further comprising:
a switch coupled between the charge pump and the oscillator,
wherein the clock monitoring circuit is configured to open the switch when no master clock signal is detected at the master clock node.

22. The apparatus of claim 19, wherein the oscillator is configured to disregard the analog input signal from the analog input node by disconnecting the analog input signal.

23. A method, comprising:
generating, through a phase locked loop (PLL), a second clock signal from a first master clock signal at a desired clock frequency different from a master clock frequency of the first master clock signal,
wherein the second clock signal is generated by an oscillator comprising an analog input node, a digital input node, a clock output node, and a digital storage element,
wherein the second clock frequency is based, at least in part, on an analog input signal received at the analog input node and at least one digital code stored in the digital storage element of the oscillator;

storing at least one digital code, corresponding to at least one output clock frequency of the oscillator, in the digital storage element received from the digital input node, wherein the at least one digital code is mapped to a particular clock frequency for output by the oscillator as the second clock frequency;

detecting that the first master clock signal is outside of a range when the clock frequency is higher than a high threshold or lower than a low threshold indicating the first master clock signal has disappeared;

when the master clock signal frequency is outside of the range indicating the first master clock signal has disappeared, discarding the analog input signal and generating the second clock signal based on a first combination of the stored at least one digital code and a predetermined analog signal applied at the analog input node of the oscillator;

when the master clock signal frequency is within the range indicating the first master clock signal is present, generating the second clock signal based on a second combination of the analog input signal and the stored at least one digital code; and programming a loop filter coupled to the oscillator for a second bandwidth from a first higher bandwidth and a second phase margin from a lower first phase margin when the first master clock signal is determined to have disappeared.

24. The method of claim 23, further comprising calibrating a set of digital codes to corresponding output frequencies of the oscillator.

25. The method of claim 23, further comprising:
recording a first relative temperature when calibrating the set of digital codes to the clock frequencies;
measuring a second relative temperature when the master clock signal is determined to not be present; and
adjusting the calibration corresponding to a difference between the first relative temperature and the second relative temperature.

26. The method of claim 23, wherein the step of discarding the analog input signal comprises disconnecting the analog input signal.

* * * * *